(12) United States Patent
Haugan (10) Patent No.: US 10,804,696 B2
(45) Date of Patent: Oct. 13, 2020

(54) POWER DISTRIBUTION SYSTEM AND METHOD

(71) Applicant: Siemens Aktiengesellschaft, Munich (DE)

(72) Inventor: Espen Haugan, Trondheim (NO)

(73) Assignee: Siemens Aktiengesellschaft, Munich (DE)

( * ) Notice: Subject to any disclaimer, the term of this patent is extended or adjusted under 35 U.S.C. 154(b) by 19 days.

(21) Appl. No.: 16/322,962

(22) PCT Filed: Jul. 24, 2017

(86) PCT No.: PCT/EP2017/068653
§ 371 (c)(1),
(2) Date: Feb. 3, 2019

(87) PCT Pub. No.: WO2018/028976
PCT Pub. Date: Feb. 15, 2018

(65) Prior Publication Data
US 2019/0173279 A1   Jun. 6, 2019

(30) Foreign Application Priority Data

Aug. 11, 2016   (EP) .................................... 16183842

(51) Int. Cl.
*H02J 1/10* (2006.01)
*H02H 7/26* (2006.01)
(Continued)

(52) U.S. Cl.
CPC ................ *H02J 1/10* (2013.01); *B63H 21/17* (2013.01); *H02H 3/28* (2013.01); *H02H 7/268* (2013.01);
(Continued)

(58) Field of Classification Search
CPC .......... H02J 1/10; H02J 3/005; H02J 2310/42; H03K 17/6874; H03K 17/567;
(Continued)

(56) References Cited

U.S. PATENT DOCUMENTS 5,789,902 A  * 8/1998  Abe ...................... H02J 7/0031
                                                    320/134
7,379,282 B1 * 5/2008  Zansky .................. H02J 1/108
                                                    361/18
(Continued)

FOREIGN PATENT DOCUMENTS

EP          2634885  A1      9/2013
EP          2974021  B1 *  11/2016   ....... H03K 17/08148
(Continued)

OTHER PUBLICATIONS

International search report and written opinion dated Nov. 10, 2017 for corresponding PCT/EP2017/068653.
(Continued)

*Primary Examiner* — Pinping Sun
(74) *Attorney, Agent, or Firm* — Wolter VanDyke Davis, PLLC (57) ABSTRACT

A DC power distribution system has power sources, a DC power distribution bus with DC bus sections. The system has power switching assemblies to couple one of the DC bus sections to another and a system controller. An inverter is connected to one of the power switching assemblies to supply a consumer. The first and second terminals are electrically coupled to first and second bus sections. First and second semiconductor devices between the terminals control current flow and there is a current connection from each terminal to a power switching assembly controller for providing an indication of current. A control signal line is connected between the power switching assembly controller and each semiconductor device provides a signal to the
(Continued)

semiconductor devices to control the current flow and an inverter coupler couples each current connection to the inverter. The inverter coupler has a feed from each current connection to the inverter.

11 Claims, 4 Drawing Sheets

(51) Int. Cl.
*H02H 7/28* (2006.01)
*H02H 3/28* (2006.01)
*B63H 21/17* (2006.01)
*H03K 17/687* (2006.01)
*H03K 17/567* (2006.01)
*H02J 3/00* (2006.01)
*H02P 27/06* (2006.01)

(52) U.S. Cl.
CPC ............ *H02H 7/28* (2013.01); *H03K 17/567* (2013.01); *H03K 17/6874* (2013.01); *B63B 2241/22* (2013.01); *H02J 3/005* (2013.01); *H02P 27/06* (2013.01); *H03K 2217/009* (2013.01)

(58) Field of Classification Search
CPC .... H03K 2217/009; B63H 21/17; H02H 3/28; H02H 7/28; H02H 7/268; B63B 2241/22; H02P 27/06
See application file for complete search history.

(56) References Cited

U.S. PATENT DOCUMENTS

| | | | |
|---|---|---|---|
| 8,450,977 B2 * | 5/2013 | Niculae | ........... H02M 1/08 320/134 |
| 8,546,976 B2 | 10/2013 | Sannino et al. | |
| 8,975,875 B2 * | 3/2015 | Caraghiorghiopol | ... G06F 1/263 320/140 |
| 9,590,419 B2 * | 3/2017 | Boe | .......... H03K 17/18 |
| 9,735,573 B2 | 8/2017 | Lindtjorn | |
| 9,735,973 B2 | 8/2017 | Lindtjorn | |
| 10,491,137 B2 * | 11/2019 | Mouridsen | ............. H02J 9/062 |
| 2011/0140534 A1 * | 6/2011 | Yasugi | ................. H02J 3/386 307/80 |
| 2013/0162023 A1 * | 6/2013 | Watanabe | .............. B60L 50/50 307/9.1 |
| 2013/0307343 A1 * | 11/2013 | Behrends | ................ H02J 1/10 307/85 |
| 2014/0078628 A1 * | 3/2014 | Valdes | ................... H02H 7/30 361/62 |
| 2016/0134212 A1 * | 5/2016 | Kikuchi | .............. B62D 5/0484 318/400.21 |
| 2016/0149393 A1 * | 5/2016 | Valdes | ................. H02H 3/305 361/93.1 |
| 2016/0285382 A1 * | 9/2016 | Ichihara | ................... H02P 3/22 |
| 2017/0077859 A1 * | 3/2017 | Chretien | ................ H02P 1/426 |

FOREIGN PATENT DOCUMENTS

| | | |
|---|---|---|
| JP | 2012514962 A | 6/2012 |
| JP | 2015515243 A | 5/2015 |
| WO | 2010066888 A2 | 6/2010 |
| WO | 2012038101 A1 | 3/2012 |
| WO | 2014139559 A1 | 9/2014 |

OTHER PUBLICATIONS

EP search report dated Aug. 2, 2017 for corresponding EP patent application No. 16183842.0.

* cited by examiner

POWER DISTRIBUTION SYSTEM AND METHOD

CROSS REFERENCE TO RELATED APPLICATIONS

This application is the US National Stage of International Application No. PCT/EP2017/068653 filed Jul. 24, 2017, and claims the benefit thereof. The International Application claims the benefit of European Application No. EP16183842 filed Aug. 11, 2016. All of the applications are incorporated by reference herein in their entirety.

FIELD OF INVENTION

This invention relates to a method of operating a direct current (DC) power distribution system, in particular for an offshore platform or vessel.

BACKGROUND OF INVENTION

On offshore platforms or vessels, much equipment is deemed to be critical and regulatory requirements specify the availability of power in the event of a fault. Consequentially, it has been normal practice to separate the vessel equipment into sections and provide separate power to each section, with redundancy, so that if a fault occurs in one section, it does not transfer to the other and not all operational capability is lost. This separation has been achieved by operating with bus ties between the sections normally open and only in limited circumstances closing those bus ties to enable one side to receive power from the other.

US20130187451 describes a power switching assembly which may be operated as a breaker to disconnect first and second terminals of the assembly from one another in the case of a current flow exceeding a permitted value. Such a power switching assembly opens up the possibility of operating the platform or vessel power distribution system with bus ties normally closed.

SUMMARY OF INVENTION

In accordance with a first aspect of the present invention a DC power distribution system comprising a plurality of power sources; a DC power distribution bus comprising a plurality of DC bus sections; wherein at least one power source is coupled to each of the DC bus sections; the system further comprising one or more power switching assemblies; wherein a power switching assembly couples one of the plurality of DC bus sections to another of the plurality of DC bus sections, a system controller to control the power sources and the power switching assemblies; and an inverter connected to one of the power switching assemblies to supply a consumer; wherein the power switching assembly comprises a first terminal and a second terminal, the first terminal being electrically coupled to a first bus section of the power distribution bus and the second terminal being electrically coupled to a second bus section of the power distribution bus; a first semiconductor device and a second semiconductor device electrically coupled between the first terminal and the second terminal to control current flow between the first terminal and the second terminal; a current connection from each terminal to a power switching assembly controller for providing an indication of current at the first terminal and at the second terminal; a control signal line connected between the power switching assembly controller and each semiconductor device for providing a control signal to the semiconductor devices to control the current flow through them; and an inverter coupler for coupling each current connection to the inverter; wherein the inverter coupler comprises a feed from each current connection on each side of the power switching assembly to the inverter.

The semiconductor devices, diodes and isolation switches still perform other functions for the power switching assembly, but the diode and semiconductor circuit makes it possible to achieve a unidirectional current flow on each side and block current flow in the reverse direction on each side.

The power switching assembly may be configured to switch power in the DC power distribution bus.

The power switching assembly controller may be configured to receive an indication of current at each terminal through the or each current connection and to control the first semiconductor device and the second semiconductor device based on the received indication of current.

Advantageously, the semiconductor device comprises an insulated gate bipolar transistor.

Advantageously, the power source comprises one of a prime mover, a generator, or an energy store.

In accordance with a second aspect of the present invention, a method of operating a DC power distribution system comprising a plurality of power sources; a DC power distribution bus comprising a plurality of DC bus sections; at least one power source coupled to each of the DC bus sections; one or more power switching assemblies, each one coupled between one of the plurality of DC bus sections and another of the plurality of DC bus sections, a system controller to control the power sources and the power switching assemblies; and at least one consumer connected to one of the power switching assemblies by an inverter connected to each of a first and second terminal of the power switching assembly; the method comprising detecting current at the first terminal and at the second terminal of the power switching assembly; based on the detected current, providing a control signal from a power switching assembly controller to a first semiconductor device and a second semiconductor device electrically coupled between the first terminal and the second terminal to control current flow between the first terminal and the second terminal to provide a required current level at one of the terminals; and supplying current to the inverter through an inverter coupler from the one terminal at which the required current level is provided.

The current supplied to the inverter through the inverter coupler may be supplied through a feed from the current connection, a feed being provided from each current connection on each side of the power switching assembly to the inverter.

Advantageously, the system controller provides an instruction to the power switching assembly controller to supply power to a specific consumer.

Advantageously, the method further comprises monitoring the voltage at the terminals of the power switching assembly to determine whether a fault condition has been corrected.

Advantageously, the method further comprises ceasing supply of power to that consumer on receipt of a further instruction from the system controller.

Advantageously, the method further comprises comparing voltages at the first terminal and the second terminal and supplying current to the inverter through the inverter coupler from the terminal at which the voltage is higher.

BRIEF DESCRIPTION OF THE DRAWINGS

An example of a power distribution system and method according to the present invention will now be described with reference to the accompany drawings in which.

DETAILED DESCRIPTION OF INVENTION

Figure 1:
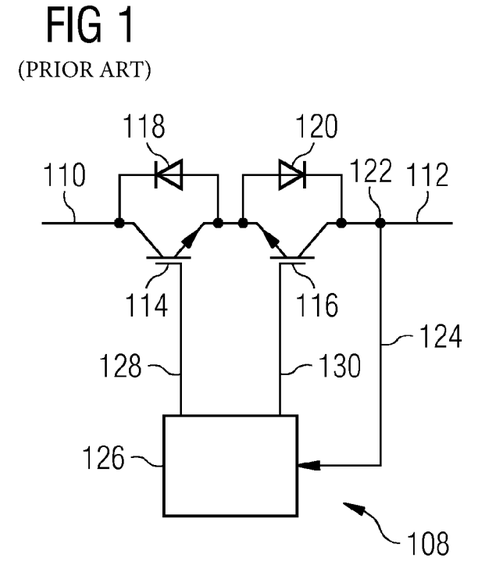
FIG. 1 illustrates an example of a conventional power switching assembly.

In a conventional DC power distribution system installed on an offshore platform or vessel, normally open breakers between buses within the system may be exchanged for a power switching assembly of the type described in US20130187451 and shown in FIG. 1, so that the power distribution system can be operated with the breakers normally closed.

The power switching assembly 108 comprises a first semiconductor element 114 and a second semiconductor element 116 electrically coupled between a first terminal 110 and the second terminal 112 so as to provide controllability of a current flow from the first terminal 110 to the second terminal 112 and from the second terminal 112 to the first terminal 110. The semiconductor elements 114, 116 are insulated gate bipolar transistors coupled to the terminals 110, 112 such that the first semiconductor element 114 conducts current from the first terminal 110 to the second terminal 112 and that the second semiconductor element 116 conducts current from the second terminal 112 to the first terminal 110. In order to bypass the respective other semiconductor element, freewheel diodes 118, 120 as further semiconductor elements are provided. In particular, a first diode 118 is coupled in parallel to the first semiconductor element 114 wherein the conduction direction of the first semiconductor element 114 is reverse to the conduction direction of the associated first diode 118. Likewise, a second diode 120 is coupled in parallel to the second semiconductor element 116 wherein the conduction direction of the second semiconductor element 116 is reverse to the conduction direction of the associated second diode 120, as shown in FIG. 1. The first and second semiconductor elements 114, 116 are coupled in series between the first terminal 110 and the second terminal 112.

The power switching assembly 108 further comprises a current sensor 122 coupled in series to the first and second semiconductor elements 114, 116 (transistors). The current sensor 122 is configured for sensing a current flowing between the first terminal 110 and the second terminal 112 and providing a current signal 124 to a controller 126, in response thereto. The controller 126 of the power switching assembly 108 is configured for receiving the current signal 124 and controlling in response thereto the first semiconductor element 114 and the second semiconductor element 116, e.g. by providing a first voltage signal 128 to the first semiconductor element 114 and a second voltage signal 130 to the second semiconductor element 116.

The controller 126 may be configured for controlling the first semiconductor element 114 and the second semiconductor element 116 so as to connect and disconnect a power distribution bus section to another bus section at each terminal, depending on the current signal 124, so the power switching assembly 108 acts as a breaker. This type of breaker is capable of handling the power level, typically 1000 volts (V), that occurs on the power distribution bus.

Figure 2:
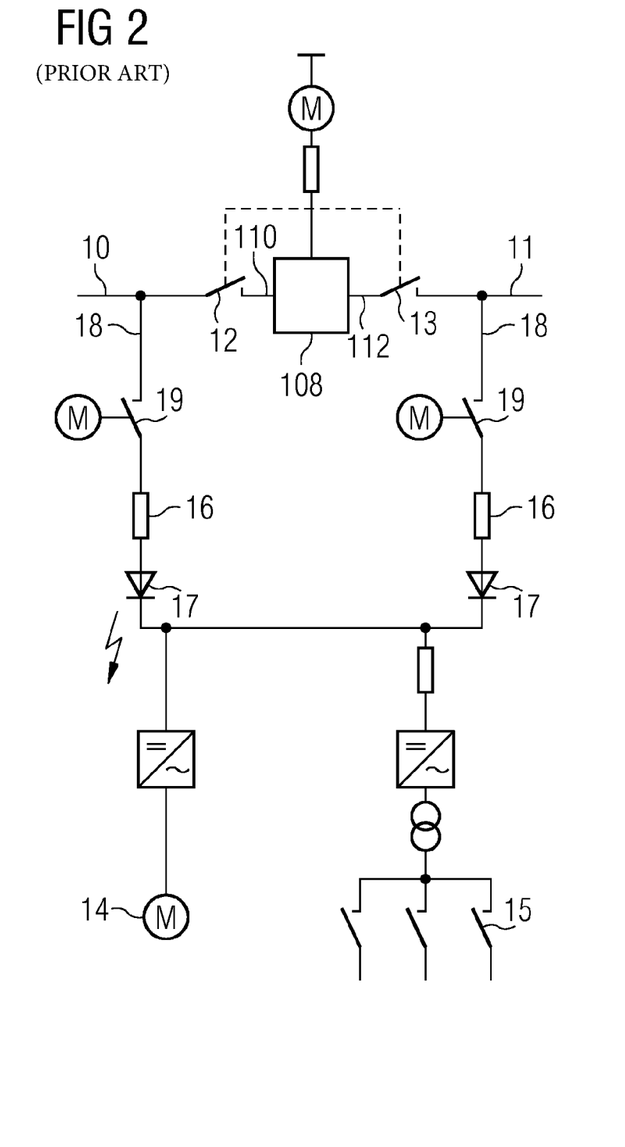
FIG. 2 illustrates the power switching assembly of FIG. 1 in a section of a power distribution system connected to supply power to a consumer.

The use of the power switching assembly of FIG. 1 allows for a considerable reduction in the number and cost of prime movers and generators on the platform whilst still providing the degree of redundancy for critical equipment, such as thrusters, that is required by the regulatory authorities for drilling or offshore production. However, when using the power switching assembly of this type as a bus tie in the system, there is a need to connect to the consumers so that the power from the DC power distribution system can be provided to the consumer. Typically, this is done as illustrated in FIG. 2.

A power switching assembly, or intelligent load controller, ILC, 108 is connected via its terminals 110, 112 between two sections 10, 11 of a DC distribution bus. Breakers 12, 13 are provided between each terminal 110, 112 and its respective bus section 10, 11. The ILC breakers may be left open in normal operation, or closed, as described with respect to US20130187451. A redundant supply is provided between one bus section 10 and the terminal 112 on the other side of the ILC 108. In order to connect the DC bus sections 10, 11 to a consumer, such as a retractable azimuth thruster 14, or a local bus 15 for connection to other consumers (not shown), a separate feeder to the thruster 14 or local bus 15 is required. Each feeder comprises a separate busbar 18 and breaker 19 with a diode 16 and fuse 17 in series to a new switchboard. In practical terms, this may amount to several meters of switchboard and many electrical components, which is costly and takes up additional space on the vessel or platform.

Figure 3:
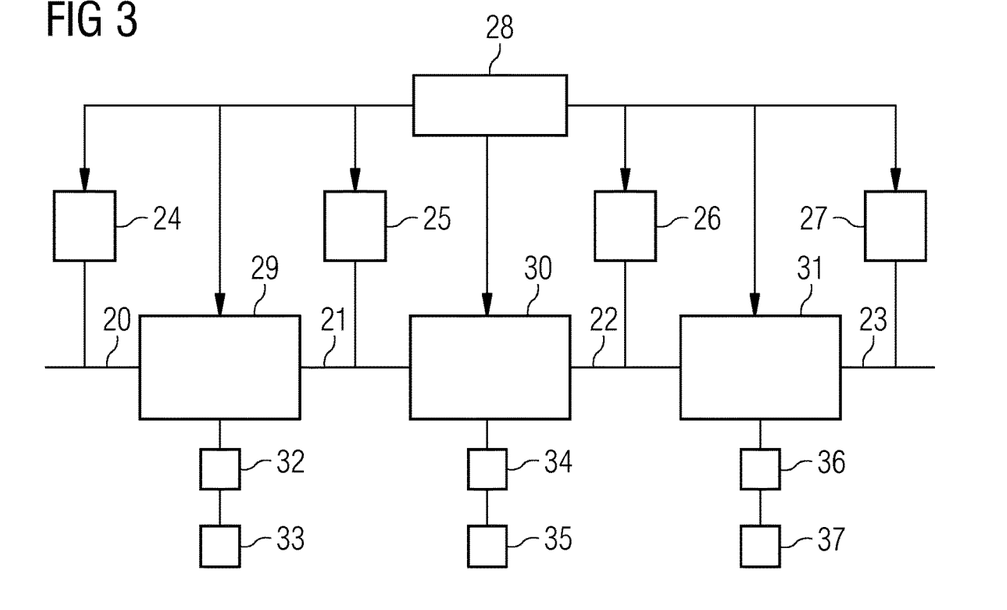
FIG. 3 shows an example of a power distribution system for carrying out a method according to the invention.

This problem is addressed by using the ILC directly as the feeder to the consumers, rather than having a separate feeder. This is illustrated in more detail in FIGS. 3 and 4. A DC power distribution system comprises a plurality of power sources 24, 25, 26, 27, a DC power distribution bus comprising a plurality of DC bus sections 20, 21, 22, 23 and at least one power source being coupled to each of the DC bus sections. One or more power switching assemblies 29, 30, 31 couple one of the DC bus sections to another of the DC bus sections and a system controller 28 is provided. The power switching assemblies 29, 30, 31 and power sources 24, 25, 26, 27, such as prime movers, generators, batteries, or capacitors, are controlled by the system controller 28 and the power switching assembly is configured to switch power in the DC power distribution bus. There may be two or more power sources per bus section. In some cases, some of the power sources may be energy stores which charge up when there is surplus power available from generators which are operating. Each bus section is connected to its neighbour by a power switching assembly 29, 30, 31, so that a load on one bus section may be driven by a generator on another bus section in normal operation, with the breakers closed and power switching assembly electrically connecting the DC bus sections. Thus, not all power sources will be in operation at all times, saving fuel for generators, or wear and tear for any type of power source. Current flow may be controlled by the power switching assembly 29, 30, 31 to limit fault currents from one bus section propagating to another bus section, e.g. in the event of a fault in a load or a bus fault. Consumers 33, 35, 37 are coupled to the DC bus sections by inverters 32, 34, 36. The consumers may be thrusters, or other critical equipment.

Figure 4:
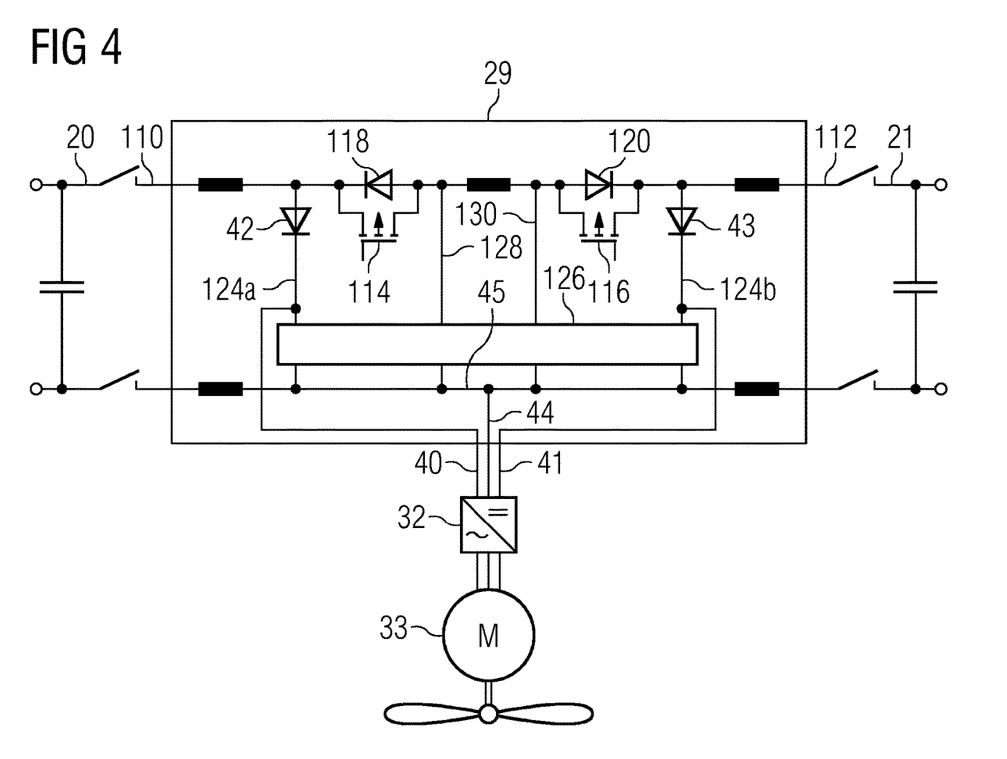
FIG. 4 shows more detail of the connections between the power distribution system of FIG. 3 and a consumer.

The connection of the power switching assembly to its consumer can be seen in more detail in FIG. 4. The power switching assembly comprises a first terminal and a second terminal, the first terminal being electrically coupled to a first bus section of the power distribution bus and the second terminal being electrically coupled to a second bus section of the power distribution bus. A first semiconductor device and a second semiconductor device are electrically coupled between the first terminal and the second terminal to control current flow between the first terminal and the second terminal. The semiconductor devices may be insulated gate bipolar transistors. A current connection is provided from each terminal to a power switching assembly controller and provides an indication of current at the first terminal and at the second terminal to the controller. The power switching assembly controller may be configured to receive an indication of current at each terminal through the or each current connection and to control the first semiconductor device and the second semiconductor device based on the received indication of current.

A control signal line connected between the power switching assembly controller and each semiconductor device is used to provide a control signal to each of the semiconductor devices to control the current flow through them. An inverter coupler couples each current connection to the inverter, so that power is supplied to a consumer associated with the inverter. The system controller may send a signal to the power switching assembly controller to cause power to be supplied in this way to a specific consumer, or to cause the supply to a specific consumer to be terminated, for example if the fault which required that consumer to come into operation has been dealt with and the equipment that had suffered the fault is now operational again.

The power switching assembly 29 is similar to that of FIG. 1 and natural inductances in the circuit are also illustrated. However, the circuit has a different implementation and is used in a different way. In the FIG. 2 example, the feed to the motor 14 through the inverter came from the DC bus section through a separate busbar 18 and breaker 19 with a diode 16 and fuse 17 in series to a new switchboard. By contrast, the present invention, as illustrated in FIG. 4, makes a connection within the power switching assembly 108. Current connections 124a, 124b enable the ILC controller 126 to detect current at both terminals of the ILC, allowing for the transistors to be controlled such that current flow in either direction between the terminals is possible. Thus, a connection 44 from the motor inverter 32 connects the inverter to line 45 within the power switching assembly 29 with an ILC snubber circuit including inverter connections 40, 41 on both sides. An inverter connection 40, 41 is taken off each of the current connections 124a, 124b between the power switching assembly controller 126 and the terminals. This makes a redundant supply to the inverter 32 and motor 33 possible from both sides and avoids the need for a separate isolation switch and separate diodes in the connection with the motor inverter 32. A diode 42, 43 may be provided in each current connection 124a, 124b to control the direction of current flow and the inverter connection 40, 41 may be taken off between the diode and the controller 126. The amount of current flow in each line 124a, 124b is controlled by the ILC controller 126 modifying control signals 128, 130 to the transistors 114, 116.

The inverter connections 40, 41 provide a feed to the inverter 32 of the current that has been set by the ILC controller. The inverter converts DC to an alternating current (AC) to drive a consumer 33, shown here as a motor of a thruster. In the event of a fault causing the supply from bus section 20 to fail, the thruster can continue to receive power from the bus section 21, or vice versa. If both bus sections 20, 21 are operating, then the ILC controller 126 controls which side the current supply is on by comparing the available voltage at the terminals 110, 112 and adjusting the flow of current through the semiconductor devices 114, 116 to bring the current on the side of the terminal having the higher voltage to the value required and preventing current flowing to the inverter from the terminal on the other side.

In the present invention, the ILC may be operated with the breakers on either side normally closed. As can be seen in the system diagram of FIG. 3, the system controller may control operation of multiple ILCs 29, 30, 31, their associated consumers 33, 35, 37 and the power sources 24, 25, 26, 27. A direct connection 40, 41 from one of the ILCs to the inverter 32 of its consumer 33, e.g. a thruster, means that when the controller 28 on the vessel or platform instructs a consumer 33, such as a redundant thruster, to come into operation, the thruster then draws current through the ILC 29 from the bus section 20, 21 on whichever side has the highest available voltage. Thus, even if there has been a failure of the supply on one side, the thruster will draw current from the other side. The example given is for a thruster, but the benefits apply for any component in which there is redundancy and which can be instructed to start up by the controller 18.

The present invention reduces the volume, size, cost and complexity of providing a DC supply to a consumer by altering the power switching assembly to enable it to feed the consumers directly, rather than needing a separate feeder for each consumer. This is particularly important in offshore systems which incorporate redundancy, i.e. overcapacity of critical components in order to allow for failure, such as redundant thrusters for use in case of failure of a main thruster, as the redundant component, although necessary to comply with regulatory standards, may not often be used. The more associated equipment that is also required for that redundant component, the greater the cost, for something which is rarely used, so a design which excludes some of the associated equipment altogether is desirable. Retro-fitting of a power switching assembly according to the invention is possible with existing redundant systems to free up more space and reduce maintenance requirements.

Operating a DC power distribution system according to the present invention, may comprise detecting current at first and second terminals of the power switching assembly and based on the detected current, providing a control signal from a power switching assembly controller to first and second semiconductor devices electrically coupled between the terminals. The control signal then causes the semiconductor devices to operate so that they control current flow between the terminals and provide a required current level at one of the terminals. Current is supplied to the inverter of a consumer through an inverter coupler from the terminal at which the required current level is provided. The system controller, or the power switching assembly controller may monitor the voltage at the terminals of the power switching assembly to determine whether a fault condition has been corrected.

Figure 5:
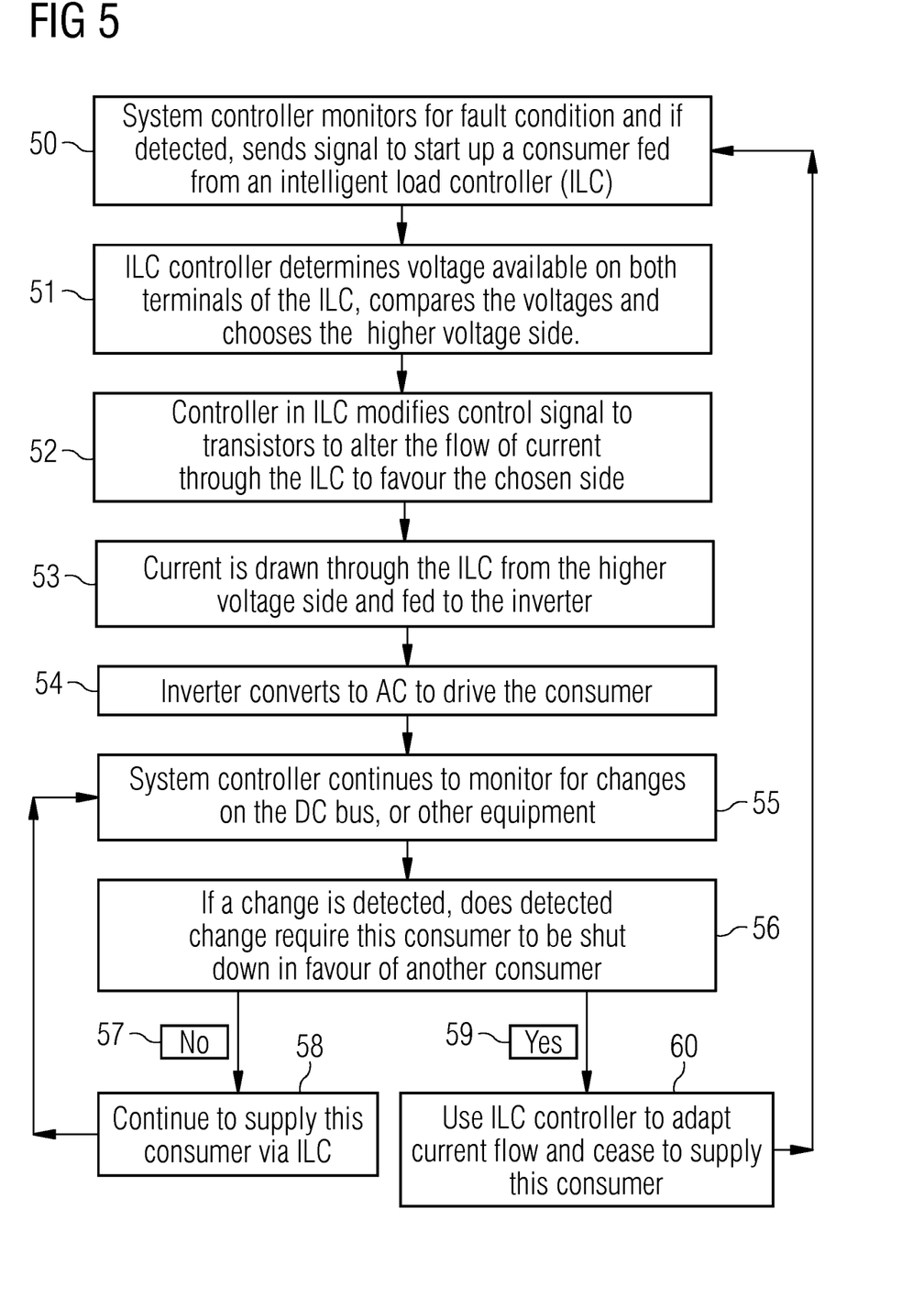
FIG. 5 is a flow diagram of the method of operation according to the invention.

The flow diagram of FIG. 5 illustrates an example of operation of a redundant system on a platform or vessel, using the power switching assembly of the present invention. In a redundant system, not all equipment that is installed is operating at any particular time. Some redundant equipment may be provided which is only brought into operation if the primary equipment cannot be used. For example, a vessel may be provided with additional thrusters which only operate if the main thrusters fail, or standby generators which are only operated if the main generator has a fault. The system controller 28 monitors 50 the system for faults, or equipment failure and if such a fault condition is detected, the system controller 28 sends a signal to the ILC controller 126 to cause it start up the appropriate redundant equipment, hereinafter referred to as a redundant consumer. The ILC controller 126 determines 51 a voltage available at each terminal 110, 112 of the ILC, effectively at the two different bus sections 20, 21 either side of the ILC 108. The ILC controller may compare voltages at the first terminal and the second terminal and supply current to the inverter through the inverter coupler connection 40, 41 from the terminal at which the voltage is higher. The ILC controller may do this by modifying 52 the control signal 128, 130 that it sends to each transistor 114, 116. Current 124a, 124b is drawn 53 through the ILC from the higher voltage side and fed along the appropriate connection 40, 41 to the inverter 32. The inverter converts 54, the DC supply to AC in order to supply the consumer 33.

Although the redundant equipment is effectively a spare, it may have to operate for a long period of time until the original piece of equipment can be replaced, for example an engine failure due to fire, or it may only be switched on for a few seconds or minutes to ensure uninterrupted operation of equipment, such as a spike in the supply to dynamic positioning or drilling equipment and when the fault has been cleared, the redundant equipment goes back to being available but not in operation. Thus, having instructed the starting of the redundant equipment the system controller 28 continues to monitor 55 for any changes within the system, such as an indication that the fault has been cleared and if the change 56 is such 59 that the redundant consumer should be shut down in favour of another, whether the original equipment that it replaced, or due to a fault occurring associated with the redundant consumer, then the system controller will instruct the ILC controller to adapt 60 the current flow again, so that there ceases to be a supply to that consumer. Thereafter, the system controller reverts to monitoring 50 for a fault condition. If the detected change 56 is not 57 one which requires the redundant consumer to be shut down, then the supply to the redundant consumer continues 58 via the ILC and the system controller continues to monitor 55 for changes.

The invention claimed is:

1. A direct current (DC) power distribution system, comprising:
   a plurality of power sources;
   a DC power distribution bus comprising a plurality of DC bus sections; wherein at least one power source of the plurality of power sources is coupled to each of the DC bus sections;
   one or more power switching assemblies; wherein one power switching assembly of the one or more power switching assemblies couples one of the plurality of DC bus sections to another of the plurality of DC bus sections, a system controller to control the plurality of power sources and the one or more power switching assemblies; and
   an inverter connected to the one of the one or more power switching assemblies to supply a consumer;
   wherein the one of the one or more power switching assemblies comprises:
      a first terminal and a second terminal, the first terminal being electrically coupled to a first bus section of the DC power distribution bus and the second terminal being electrically coupled to a second bus section of the DC power distribution bus;
      a first semiconductor device and a second semiconductor device electrically coupled between the first terminal and the second terminal to control current flow between the first terminal and the second terminal;
      a current connection from each of the first terminal and the second terminal to a power switching assembly controller for providing an indication of current at the first terminal and at the second terminal;
      a control signal line connected between the power switching assembly controller and each of the first semiconductor device and the second semiconductor device for providing a control signal to the first semiconductor device and the second semiconductor device to control the current flow through them; and
      an inverter coupler for coupling the current connection from the first terminal and the current connection from the second terminal to the inverter; wherein the inverter coupler comprises a feed from the current connection from the first terminal and the current connection from the second terminal to the inverter.

2. The DC power distribution system according to claim 1,
   wherein the one of the one or more power switching assemblies is configured to switch power in the DC power distribution bus.

3. The DC power distribution system according to claim 1,
   wherein the power switching assembly controller is configured to receive an indication of current through the current connection from the first terminal and through the current connection from the second terminal and to control the first semiconductor device and the second semiconductor device based on the received indication of current.

4. The DC power distribution system according to claim 1,
   wherein the first semiconductor device or the second semiconductor device comprises an insulated gate bipolar transistor.

5. The DC power distribution system according to claim 1,
   wherein the at least one power source of the plurality of power sources comprises one of a prime mover, a generator, or an energy store.

6. A method of operating a DC power distribution system comprising a plurality of power sources; a DC power distribution bus comprising a plurality of DC bus sections; at least one power source of the plurality of power sources coupled to each of the DC bus sections; one or more power switching assemblies, each of the one or more power switching assemblies coupled between one of the plurality of DC bus sections and another of the plurality of DC bus sections, a system controller to control the plurality of power sources and the one or more power switching assemblies; and at least one consumer connected to one of the one or more power switching assemblies by an inverter connected to each of a first and a second terminal of the one of the one or more power switching assemblies; the method comprising:
   detecting current at the first terminal and at the second terminal of the one of the one or more power switching assemblies;
   based on the detected current, providing a control signal from a power switching assembly controller to a first semiconductor device and a second semiconductor device electrically coupled between the first terminal and the second terminal to control current flow between the first terminal and the second terminal to provide a required current level at one of the first terminal and the second terminal; and supplying current to the inverter through an inverter coupler from the one of the first terminal and the second terminal at which the required current level is provided.

7. The method according to claim 6,
wherein current supplied to the inverter through the inverter coupler is supplied through a feed from a current connection from the first terminal and a current connection from the second terminal to the inverter.

8. The method according to claim 6,
wherein the system controller provides an instruction to the power switching assembly controller to supply power to a specific consumer.

9. The method according to claim 6, further comprising:
monitoring voltages at the first terminal and the second terminal of the one of the one or more power switching assemblies to determine whether a fault condition has been corrected.

10. The method according to claim 6, further comprising:
ceasing supply of power to the at least one consumer on receipt of a further instruction from the system controller.

11. The method according to claim 6, further comprising:
comparing voltages at the first terminal and the second terminal and supplying current to the inverter through the inverter coupler from a terminal at which the voltage is higher.

* * * * *